United States Patent
Chu et al.

(10) Patent No.: US 8,941,118 B1
(45) Date of Patent: Jan. 27, 2015

(54) NORMALLY-OFF III-NITRIDE TRANSISTORS WITH HIGH THRESHOLD-VOLTAGE AND LOW ON-RESISTANCE

(71) Applicant: HRL Laboratories, LLC, Malibu, CA (US)

(72) Inventors: Rongming Chu, Agoura Hills, CA (US); David F. Brown, Woodland Hills, CA (US); Adam J. Williams, Los Alamitos, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/041,667

(22) Filed: Sep. 30, 2013

(51) Int. Cl.
*H01L 29/15* (2006.01)
*H01L 29/78* (2006.01)
*H01L 29/66* (2006.01)
*H01L 29/20* (2006.01)

(52) U.S. Cl.
CPC .......... *H01L 29/78* (2013.01); *H01L 29/66522* (2013.01); *H01L 29/2003* (2013.01)
USPC ............... 257/76; 257/77; 257/192; 257/194; 257/E21.407; 257/E29.246; 257/E29.249; 257/E21.441; 257/E29.253; 257/E29.091; 438/167; 438/172; 438/287

(58) Field of Classification Search
USPC ....................... 257/76, 77, 192, 194, E29.253, 257/E29.441, E29.061, E29.246, E29.249, 257/E21.407; 438/287, 167, 172
See application file for complete search history.

(56) References Cited

U.S. PATENT DOCUMENTS

| 7,555,219 | B2 | 6/2009 | Cox |
| 8,124,505 | B1 | 2/2012 | Burnham |
| 2006/0011915 | A1 | 1/2006 | Saito |
| 2006/0060871 | A1 | 3/2006 | Beach |
| 2006/0194379 | A1 | 8/2006 | Suda et al. |
| 2007/0210332 | A1 | 9/2007 | Ueno |
| 2008/0237605 | A1 | 10/2008 | Murata |
| 2009/0146186 | A1 | 6/2009 | Kub |
| 2009/0315078 | A1 | 12/2009 | Praikh |
| 2010/0025730 | A1 | 2/2010 | Heikman |

(Continued)

FOREIGN PATENT DOCUMENTS

| JP | 2008-227501 | 9/2008 |
| WO | 2007/062589 | 6/2007 |

OTHER PUBLICATIONS

ISR/WO for related PCT/US2013/062750 mailed on Jun. 26, 2014.

(Continued)

*Primary Examiner* — Timor Karimy
(74) *Attorney, Agent, or Firm* — Ladas & Parry

(57) ABSTRACT

A III-nitride transistor includes a III-nitride channel layer, a barrier layer over the channel layer, the barrier layer having a thickness of 1 to 10 nanometers, a dielectric layer on top of the barrier layer, a source electrode contacting the channel layer, a drain electrode contacting the channel layer, a gate trench extending through the dielectric layer and barrier layer and having a bottom located within the channel layer, a gate insulator lining the gate trench and extending over the dielectric layer, and a gate electrode in the gate trench and extending partially toward the source and the drain electrodes to form an integrated gate field-plate, wherein a distance between an interface of the channel layer and the barrier layer and the bottom of the gate trench is greater than 0 nm and less than or equal to 5 nm.

26 Claims, 3 Drawing Sheets

(56) References Cited

U.S. PATENT DOCUMENTS

| | | |
|---|---|---|
| 2010/0155780 A1 | 6/2010 | Machida |
| 2012/0235160 A1 | 9/2012 | Heikman et al. |
| 2012/0261720 A1 | 10/2012 | Puglisi et al. |
| 2013/0026495 A1 | 1/2013 | Chu |
| 2013/0181224 A1 | 7/2013 | Lim et al. |

OTHER PUBLICATIONS

U.S. Appl. No. 13/456,039 (now published as US2013-0026495 A1) Notice of Allowance mailed on Jun. 6, 2014.
From U.S. Appl. No. 12/909,497 (now U.S. Patent No. 8,124,505), Application and Office Actions including but not limited to the Office Actions mailed on May 31, 2011, Oct. 24, 2011, and Nov. 10, 2011.
From U.S. Appl. No. 13/456,039 (now published as US 2013-0026495) filed Apr. 25, 2012, Application and Office Actions including but not limited to the Office Actions mailed on Mar. 22, 2013, Apr. 3, 2013 Jul. 12, 2013, Sep. 6, 2013, and Apr. 14, 2014.
PCT Search Report and Written Opinion mailed on Dec. 26, 2012 from related PCT/US2012/043114.
PCT Chapter II International Preliminary Report on Patentability mailed on Jul. 3, 2013 of related PCT/US2012/043114.
Ambacher, O. et al., "Two-dimensional electron gases induced by spontaneous and piezoelectric polarization charges in N- and Ga-face AlGaN/GaN heterostructures", Journal of Applied Physics, Mar. 1999, vol. 85, No. 6, p. 3222-3233.
Burnham, Shawn D. et al., "Gate-recessed normally-off GaN-on-Si HEMT using a new $O_2$-$BCl_3$ digital etching technique", Physica Status Solidi C, (ICNS-8), 2010, vol. 7, No. 7-8, p. 2010-2012.
Buttari, D. et al., "Digital Etching for Highly Reproducible Low Damage Gate Recessing on AlGaN/GaN HEMTs", Proceedings. IEEE Lester Eastman Conference, High Performance Devices, 2002, p. 461-469.
Buttari, D. et al., "Origin of etch delay time in Cl2 dry etching of AlGaN/GaN structures", Applied Physics Letters, Dec. 2003, vol. 83, No. 23, p. 4779-4781.
Buttari, D. et al., "Selective Dry Etching of GaN Over AlGaN in BCL3/SF6 Mixtures", Proceedings. IEEE Lester Eastman Conference, High Performance Devices, Aug. 2004, p. 132-137.
Cai, Yong, et al., "High-Performance Enhancement-Mode AlGaN/GaN HEMTs Using Fluoride-Based Plasma Treatment", IEEE Electron Device Letters, Jul. 2005, vol. 26, No. 7, p. 435-437.
Chen, T., "AlGaN/GaN MIS HEMT with ALD Dielectric," Digest of CS MANTECh Conference, pp. 227-230, Apr. 2006.
Desalvo, Gregory C. et al., "Wet Chemical Digital Etching of GaAs at Room Temperature", Journal of the Electrochemical Society, 1996, vol. 143, No. 11, p. 3652-3656.
Hashizume, T. "Capacitance-Voltage Characterization of AlN/GaN Metal-Insulator-Semiconductor Structures Grown on Sapphire Substrate by Metalorganic Chemical Vapor Deposition," Journal of Applied Physics, vol. 88, No. 4, pp. 1983-1986, Aug. 2000.
Keogh, David, et al., "Digital Etching of III-N Materials Using a Two-Step Ar/KOH Technique", Journal of Electronic Materials, 2006, vol. 35, No. 4, p. 771-776.
Khan, M. Asif, et al., "Enhancement and depletion mode GaN/AlGaN heterostructure field effect transistors", Applied Physics Letters, Jan. 1996, vol. 68, No. 4, p. 514-516.
Lanford, W.B. et al., "Recessed-gate enhancement-mode GaN HEMT with high threshold voltage", Electronics Letters, Mar. 2005, vol. 41, No. 7, p. 449-450.
Ludviksson, Audunn, et al., "Atomic layer etching chemistry of Cl2 on GaAs(100)", Surface Science, 1992, vol. 277, p. 282-300.
Maher, H. et al., "Smooth wet etching by ultraviolet-assisted photoetching and its application to the fabrication of AlGaN/GaN heterostructure field-effect transistors", Applied Physics Letters, Dec. 2000, vol. 77, No. 23, p. 3833-3835.
Moon, Jeong S. et al., "Submicron Enhancement-mode AlGaN/GaN HEMTs", Device Research Conference, 2002. 60th DRC. Conference Digest, p. 23-24.
Okamoto et al. "179 W recessed-gate AlGaN/GaN heterojunction FET with field-modulating plate" Electronics Letters, May 13, 2004, vol. 40, No. 10.
Parish, G. et al., "Simple Wet Etching of GaN", Proceedings of SPIE, Device and Process Technologies for MEMS and Microelectronics II, 2001, vol. 4592, p. 104-110.

NORMALLY-OFF III-NITRIDE TRANSISTORS WITH HIGH THRESHOLD-VOLTAGE AND LOW ON-RESISTANCE

CROSS REFERENCE TO RELATED APPLICATIONS

This application is related to U.S. patent application Ser. No. 13/456,039, filed Apr. 25, 2012, which is incorporated herein as though set forth in full.

TECHNICAL FIELD

This disclosure relates to III-Nitride field effect transistors (FETs) and in particular to normally off FETs.

BACKGROUND

III-nitride transistors are promising for high-speed and high-power applications, such as power switches, which may be used for motor drivers and power supplies, among other applications. Many of these applications require the transistor to operate in normally-off mode. Normally-off mode operation can be realized by a number of approaches, but typically at the penalty of higher on-resistance and lower output-current.

U.S. patent application Ser. No. 13/456,039, filed Apr. 25, 2012 describes a normally-off III-Nitride field-effect transistor and a method for making a normally-off FET.

What is needed is a normally-off FET, which has a minimal penalty in on-resistance. In particular what is desired is a high threshold voltage, preferably greater than one volt, a low on-resistance, preferably less than 20 ohm-mm for devices with more than 600V breakdown voltage, and an excellent uniformity in threshold voltage and on-resistance, with preferably less than 10% of standard deviation. The embodiments of the present disclosure answer these and other needs.

SUMMARY

In a first embodiment disclosed herein, a III-nitride transistor comprises a III-nitride channel layer, a barrier layer over the channel layer, the barrier layer having a thickness of 1 to 10 nanometers, a dielectric layer on top of the barrier layer, a source electrode contacting the channel layer, a drain electrode contacting the channel layer, a gate trench extending through the dielectric layer and barrier layer and having a bottom located within the channel layer, a gate insulator lining the gate trench and extending over the dielectric layer, and a gate electrode in the gate trench and extending partially toward the source electrode and the drain electrode to form an integrated gate field-plate, wherein a distance between an interface of the channel layer and the barrier layer and the bottom of the gate trench is greater than 0 nanometers and less than or equal to 5 nanometers.

In another embodiment disclosed herein, a III-nitride transistor comprises a III-nitride channel layer, a barrier layer over the channel layer, a dielectric layer on top of the barrier layer, a source electrode contacting the channel layer, a drain electrode contacting the channel layer, a gate trench extending through the dielectric layer and barrier layer and having a bottom located within the channel layer, a gate insulator lining the gate trench and extending over the dielectric layer, the gate insulator comprising a single-crystalline AlN layer at the bottom of the gate trench, a polycrystalline AlN layer on the single crystalline AlN layer, and an insulating layer comprising $AL_2O_3$, AlON, or SiN on the polycrystalline AlN layer, and a gate electrode in the gate trench and extending partially toward the source electrode and the drain electrode to form an integrated gate field-plate.

In yet another embodiment disclosed herein, a method of fabricating a III-nitride transistor comprises forming a III-nitride channel layer, forming a barrier layer over the channel layer, the barrier layer having a thickness of 1 to 10 nanometers, forming a dielectric layer on top of the barrier layer, forming a source electrode contacting the channel layer, forming a drain electrode contacting the channel layer, forming a gate trench extending through the dielectric layer and barrier layer and having a bottom located within the channel layer so that a distance between an interface of the channel layer and the barrier layer and the bottom of the gate trench is greater than 0 nanometers and less than or equal to 5 nanometers, forming a gate insulator lining the gate trench and extending over the dielectric layer, and forming a gate electrode in the gate trench and extending partially toward the source electrode and the drain electrode to form an integrated gate field-plate.

In still another embodiment disclosed herein, a method of fabricating a III-nitride transistor comprises forming a III-nitride channel layer, forming a barrier layer over the channel layer, forming a dielectric layer on top of the barrier layer, forming a source electrode contacting the channel layer, forming a drain electrode contacting the channel layer, forming a gate trench extending through the dielectric layer and barrier layer and having a bottom located within the channel layer, forming a gate insulator lining the gate trench and extending over the dielectric layer, the gate insulator comprising a single-crystalline AlN layer at the bottom of the gate trench, a polycrystalline AlN layer on the single crystalline AlN layer, and an insulating layer comprising $AL_2O_3$, AlON, or SiN on the polycrystalline AlN layer, and forming a gate electrode in the gate trench and extending partially toward the source electrode and the drain electrode to form an integrated gate field-plate.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
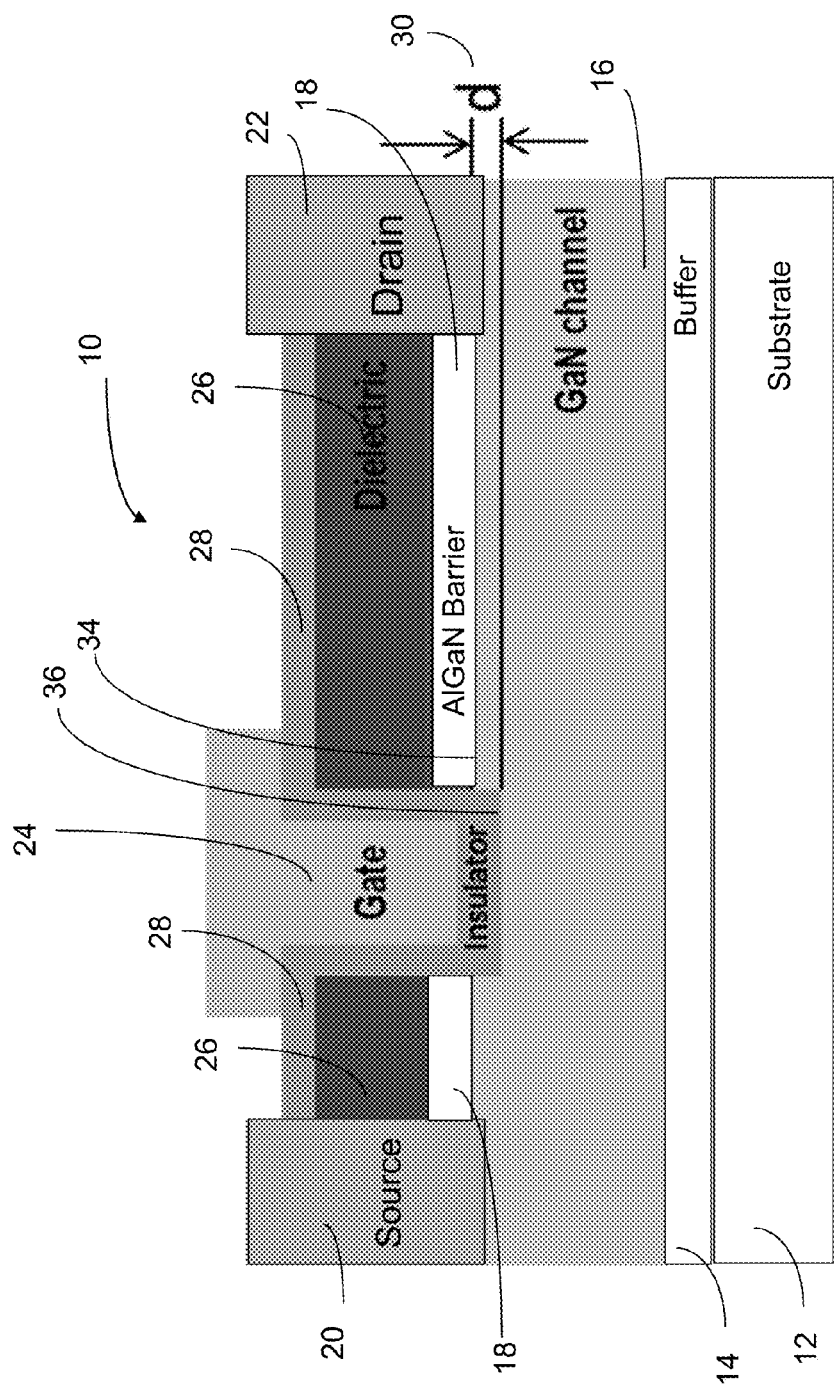
FIG. 1 shows a diagram of III-nitride field effect transistor in accordance with the present disclosure.

FIG. 1 shows an elevation sectional view of a device structure for a FET 10 in accordance with the present disclosure.

The FET has a buffer layer 14 formed on a substrate 12. A channel layer 16 is formed on the buffer layer 14 and a barrier layer 18, is formed on the channel layer 16.

The substrate 12 material may be silicon (Si), silicon carbide (SiC), sapphire, gallium nitride (GaN), or aluminum nitride (AlN).

The buffer layer 14 may be a stack of III-Nitride materials grown on the substrate 12 by chemical vapor deposition or molecular beam epitaxy.

The channel layer 16 may be a III-Nitride material, such as GaN, grown on the buffer layer 14 by chemical vapor deposition or molecular beam epitaxy. Typically the channel layer 16 is an undoped GaN layer with the thickness ranging from 5 nanometers to a few micrometers.

The barrier layer 18 may be 1-10 nanometers thick and may typically be only 5 nm thick. The barrier layer 18 may be AlGaN, with a 25% Al composition.

A dielectric layer 26 is formed on top of the barrier layer 18, and may be SiN and have a thickness of 10 to 200 nanometers and may be typically 100 nm thick. The dielectric layer 26 may be deposited by MOCVD and LPCVD.

A source electrode 20 and a drain electrode 22 are in contact with the channel layer 16 and extend through the dielectric layer 26 and the barrier layer 18. The source electrode 20 and drain electrode 22 are on opposite ends of the channel layer 16.

Figure 2:
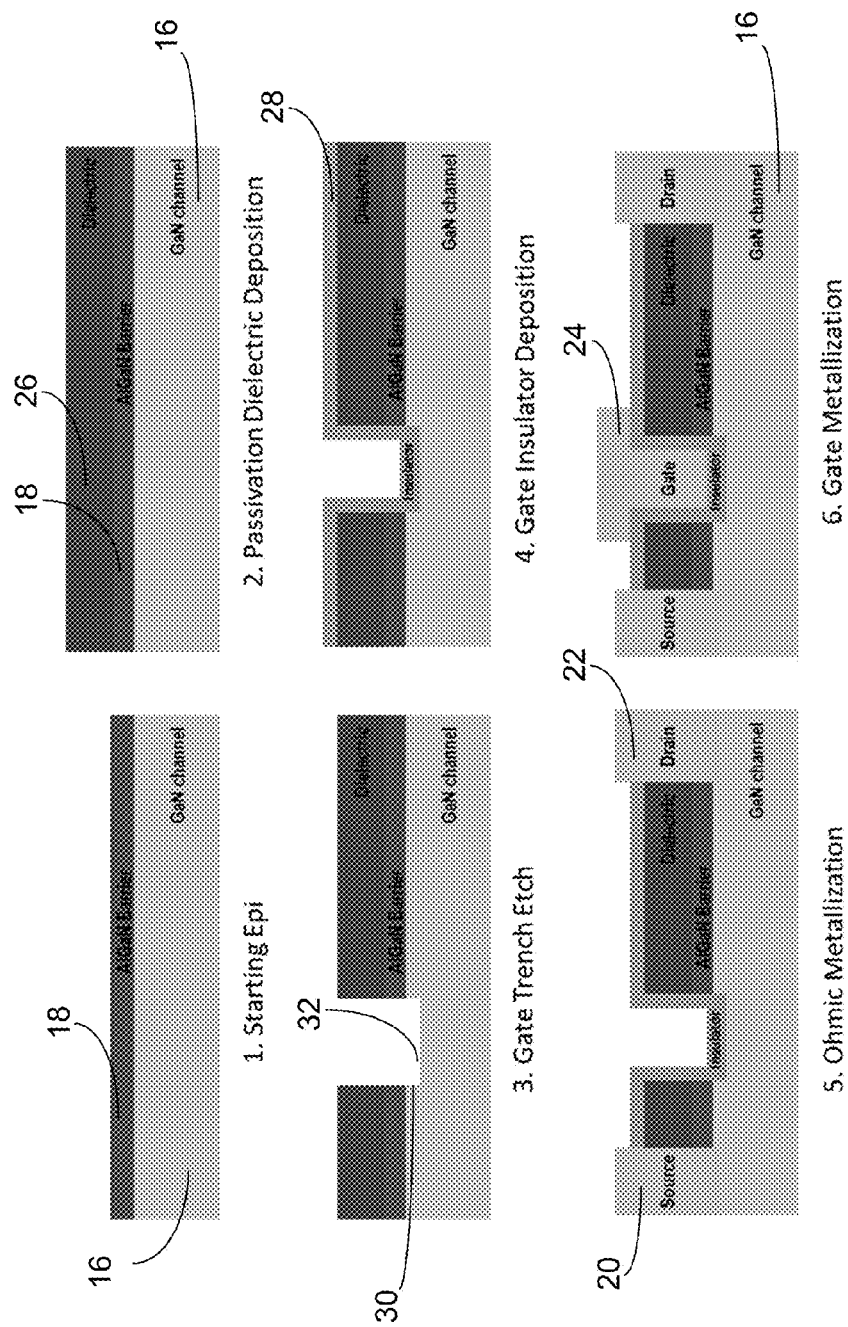
FIG. 2 shows a process flow for making a III-nitride field effect transistor in accordance with the present disclosure.

A gate trench 32, as seen in FIG. 2 step 3, is formed through the dielectric layer 26 and the barrier layer 18. The bottom of the gate trench 32 is located within the channel layer 16, and extends below the barrier layer 18 and into the channel layer 16 by a vertical distance d 30. This distance d 30 is between a barrier layer and channel layer interface 34 and the bottom 36 of the gate trench 32, and is typically between 0 and 5 nanometers (nm). The distance d needs to be greater than 0 nm for normally-off operation, and needs to be as small as possible to in order to minimize the on-resistance.

A gate insulator 28 is formed in the gate trench 32 and over the dielectric 26. The gate insulator 28 may include a stack of: a layer of single-crystalline AlN at the bottom of the gate trench 32, which is up to 2 nm thick and typically 1 nm thick; a layer of polycrystalline AlN on the single crystalline AlN layer, which is 5 nm to 50 nm thick and typically 25 nm thick; and an insulating layer, such as $AL_2O_3$, AlON, or SiN, formed on the polycrystalline AlN layer, which is 1 nm to 50 nm thick and typically 5 nm thick.

The single crystalline AlN is preferably grown at a temperature greater than 600 C, and less than 1100 C. A preferred temperature for growing the single crystalline AlN is 900 C. The poly crystalline AlN is preferably grown at a temperature greater than 300 C, and less than 900 C, and a preferred temperature is 600 C.

The gate insulator 28 stack makes the FET 10 a normally off FET. Under a positive gate bias the FET has a very low gate leakage, and a high-mobility electron channel is formed at the interface between the gate insulator 18 and the channel layer 16.

The single-crystalline AlN layer of the gate insulator stack 28 provides a high-quality interface for electron transport in the channel layer 16 without causing accumulation of a two-dimensional electron gas (2DEG) in the channel. Furthermore, the single crystalline AlN layer provides an energy barrier to prevent electron trapping into the poly-crystalline AlN layer.

The polycrystalline AlN layer is the main layer supporting the gate bias, and the oxidized AlN layer serves a blocking layer to leakage paths through grain boundaries of the poly-crystalline AlN layer.

The gate insulator is formed over the dielectric 26 and extends to the source electrode 20 and to the drain electrode 22.

A gate electrode 24 is formed over the gate insulator 28 in the gate trench 32 and may extend partially toward the source electrode 20 and partially toward the drain electrode 22 to form an integrated gate field-plate.

Controlling the depth of gate trench 32 achieves a normally-off operation, while minimizing the resistance components associated with the vertical distances between the barrier layer/channel layer interface and the bottom of the gate trench 32. As discussed above, the distance d 30 needs to be greater than 0 nm for normally-off operation, and needs to be as small as possible to in order to minimize the on-resistance.

The barrier layer 18, which is typically 5 nm, allows accurate control of the gate trench 32 depth 30 with high uniformity. When etching the gate trench through the barrier layer, some over etch is always the result and about 10% over etch is typical. So if the barrier layer 18 were 50 nm thick, then the over etch would be on the order of 5 nm, which would be a relatively large over etch. With a barrier layer 18 of only about 5 nm thickness, the over etch is more controlled and a 10% over etch would be only 0.5 nm. Therefore, a barrier layer 18 that is only about 5 nm, allows the distance d 30 to be better controlled.

FIG. 2 shows a process flow for making a III-nitride field effect transistor in accordance with the present disclosure. In step 1 the epi layers are grown for the channel layer 16 and the barrier layer 18. In step 2 dielectric layer 26 is deposited on the barrier layer 18. Then in step 3 a gate trench 32 is etched through the dielectric layer 26 and the barrier layer 18 and then etched into the channel layer 16 by a distance d 30. In step 4 the gate insulator stack 28 is formed. Then in step 5 the source electrode 20 and the drain electrode 22 are formed by etching through the gate insulator 28, the dielectric 26, and the barrier layer 18 and then forming metal for the source electrode 20 and the drain electrode 22. Next in step 6, the gate electrode 24 is metallized.

Figure 3A:
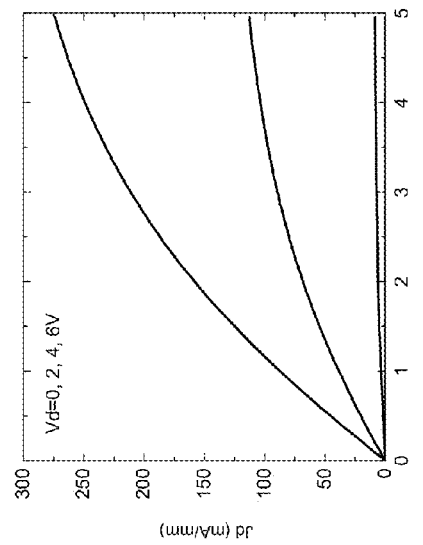
FIGS. 3A-3C shows graphs of typical current-voltage curves for a III-nitride field effect transistor in accordance with the present disclosure.
Figure 3B:
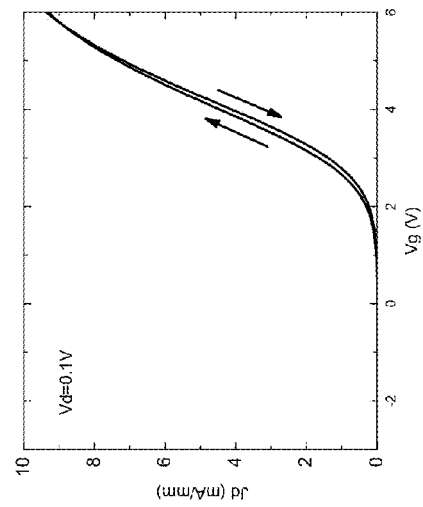
Figure 3C:
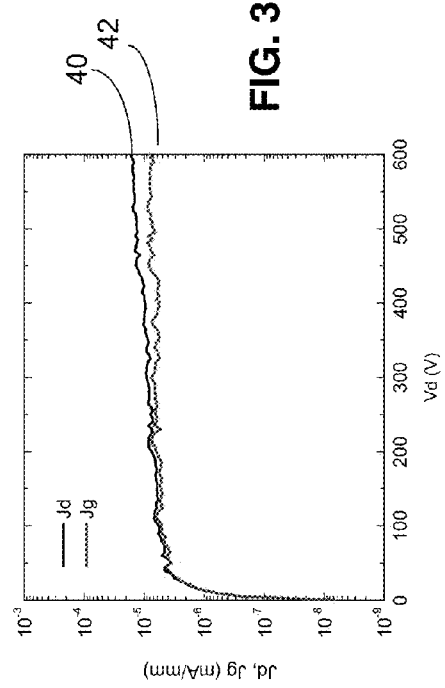

FIGS. 3A-3C show graphs of typical current-voltage curves for a III-nitride field effect transistor in accordance with the present disclosure. The graphs indicate that the threshold voltage is at least 1V, that the on-resistance is 20 ohm-mm or less, and that the breakdown voltage is at least 600V.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . ." and no method or process step herein is to be construed under those provisions unless the step, or steps, are expressly recited using the phrase "comprising the step(s) of . . . ."

What is claimed is:

1. A III-nitride transistor comprising:
   a III-nitride channel layer;
   a barrier layer over the channel layer, the barrier layer having a thickness of 1 to 10 nanometers;
   a dielectric layer on top of the barrier layer;
   a source electrode contacting the channel layer;
   a drain electrode contacting the channel layer;
   a gate trench extending through the dielectric layer and barrier layer and having a bottom located within the channel layer;
   a gate insulator lining the gate trench and extending over the dielectric layer; and
   a gate electrode in the gate trench and extending partially toward the source electrode and the drain electrode to form an integrated gate field-plate;
   wherein a distance between an interface of the channel layer and the barrier layer and the bottom of the gate trench is greater than 0 nanometers and less than or equal to 5 nanometers.

2. The transistor of claim 1 wherein:
   the channel layer is GaN; and
   the barrier layer is AlGaN.

3. The transistor of claim 1 wherein the gate insulator comprises:
   a single-crystalline AlN layer at the bottom of the gate trench;
   a polycrystalline AlN layer on the single crystalline AlN layer; and
   an insulating layer comprising $AL_2O_3$, AlON, or SiN on the polycrystalline AlN layer.

4. The transistor of claim 3 wherein:
   the single crystalline AlN layer is up to 2 nm thick;
   the polycrystalline AlN layer is 5 nm to 50 nm thick; and
   the insulating layer is 1 nm to 50 nm thick.

5. The transistor of claim 1 wherein:
   a threshold voltage of the transistor is at least 1V;
   an on-resistance of the transistor is 20 ohm-mm or less; and
   a breakdown voltage of the transistor is at least 600V.

6. The transistor of claim 1 wherein:
   the dielectric layer is 10 to 200 nanometers thick; and
   the channel layer is 5 nanometers to 2 micrometers thick.

7. The transistor of claim 1 further comprising:
   an AlN spacer layer up to 1 nanometer thick between the barrier layer and the channel layer.

8. A III-nitride transistor comprising:
   a III-nitride channel layer;
   a barrier layer over the channel layer;
   a dielectric layer on top of the barrier layer;
   a source electrode contacting the channel layer;
   a drain electrode contacting the channel layer;
   a gate trench extending through the dielectric layer and barrier layer and having a bottom located within the channel layer;
   a gate insulator lining the gate trench and extending over the dielectric layer, the gate insulator comprising a single-crystalline AlN layer at the bottom of the gate trench, a polycrystalline AlN layer on the single crystalline AlN layer, and an insulating layer comprising $AL_2O_3$, AlON, or SiN on the polycrystalline AlN layer; and
   a gate electrode in the gate trench and extending partially toward the source electrode and the drain electrode to form an integrated gate field-plate.

9. The transistor of claim 8 wherein:
   the single crystalline AlN layer is up to 2 nm thick;
   the polycrystalline AlN layer is 5 nm to 50 nm thick; and
   the insulating layer is 1 nm to 50 nm thick.

10. The transistor of claim 8 wherein:
    the barrier layer has a thickness of 1 to 10 nanometers; and
    a distance between an interface of the channel layer and the barrier layer and the bottom of the gate trench is greater than 0 nanometers and less than or equal to 5 nanometers.

11. The transistor of claim 8 wherein:
    the channel layer is GaN; and
    the barrier layer is AlGaN.

12. The transistor of claim 8 wherein:
    a threshold voltage of the transistor is at least 1V;
    an on-resistance of the transistor is 20 ohm-mm or less; and
    a breakdown voltage of the transistor is at least 600V.

13. The transistor of claim 8 wherein:
    the dielectric layer is 10 to 200 nanometers thick; and
    the channel layer is 5 nanometers to 2 micrometers thick.

14. The transistor of claim 8 further comprising:
    an AlN spacer layer up to 1 nanometer thick between the barrier layer and the channel layer.

15. A method of fabricating a III-nitride transistor comprising:
    forming a III-nitride channel layer;
    forming a barrier layer over the channel layer, the barrier layer having a thickness of 1 to 10 nanometers;
    forming a dielectric layer on top of the barrier layer;
    forming a source electrode contacting the channel layer;
    forming a drain electrode contacting the channel layer;
    forming a gate trench extending through the dielectric layer and barrier layer and having a bottom located within the channel layer so that a distance between an interface of the channel layer and the barrier layer and the bottom of the gate trench is greater than 0 nanometers and less than or equal to 5 nanometers;
    forming a gate insulator lining the gate trench and extending over the dielectric layer; and
    forming a gate electrode in the gate trench and extending partially toward the source electrode and the drain electrode to form an integrated gate field-plate.

16. The method of claim 15 wherein:
    the channel layer is GaN; and
    the barrier layer is AlGaN.

17. The method of claim 15 wherein forming the gate insulator comprises:
    forming a single-crystalline AlN layer at the bottom of the gate trench;
    forming a polycrystalline AlN layer on the single crystalline AlN layer; and
    forming an insulating layer comprising $AL_2O_3$, AlON, or SiN on the polycrystalline AlN layer.

18. The method of claim 17 wherein:
the single crystalline AlN layer is up to 2 nm thick;
the polycrystalline AlN layer is 5 nm to 50 nm thick; and
the insulating layer is 1 nm to 50 nm thick.

19. The method of claim 17 wherein:
the single crystalline AlN layer is formed at a temperature greater than 600 C and lower than 1100 C; and
the polycrystalline AlN layer is formed at a temperature greater than 300 C and lower than 900 C.

20. The method of claim 15 further comprising:
forming an AlN spacer layer up to 1 nanometer thick between the barrier layer and the channel layer.

21. A method of fabricating a III-nitride transistor comprising:
forming a III-nitride channel layer;
forming a barrier layer over the channel layer;
forming a dielectric layer on top of the barrier layer;
forming a source electrode contacting the channel layer;
forming a drain electrode contacting the channel layer;
forming a gate trench extending through the dielectric layer and barrier layer and having a bottom located within the channel layer;
forming a gate insulator lining the gate trench and extending over the dielectric layer, the gate insulator comprising a single-crystalline AlN layer at the bottom of the gate trench, a polycrystalline AlN layer on the single crystalline AlN layer, and an insulating layer comprising $AL_2O_3$, AlON, or SiN on the polycrystalline AlN layer; and
forming a gate electrode in the gate trench and extending partially toward the source electrode and the drain electrode to form an integrated gate field-plate.

22. The method of claim 21 wherein:
the single crystalline AlN layer is up to 2 nm thick;
the polycrystalline AlN layer is 5 nm to 50 nm thick; and
the insulating layer is 1 nm to 50 nm thick.

23. The method of claim 21 wherein:
the barrier layer has a thickness of 1 to 10 nanometers; and
a distance between an interface of the channel layer and the barrier layer and the bottom of the gate trench is greater than 0 nanometers and less than or equal to 5 nanometers.

24. The method of claim 21 wherein:
the channel layer is GaN; and
the barrier layer is AlGaN.

25. The method of claim 21 further comprising:
forming an AlN spacer layer up to 1 nanometer thick between the barrier layer and the channel layer.

26. The method of claim 21 wherein:
the single crystalline AlN layer is formed at a temperature greater than 600 C and lower than 1100 C; and
the polycrystalline AlN layer is formed at a temperature greater than 300 C and lower than 900 C.

* * * * *